United States Patent
Sherman et al.

(10) Patent No.: US 12,391,568 B2
(45) Date of Patent: Aug. 19, 2025

(54) ION PRODUCTION SYSTEM WITH EFFICIENT ION COLLECTION

(71) Applicant: SHINE Technologies, LLC, Janesville, WI (US)

(72) Inventors: Joseph Sherman, Santa Fe, NM (US); Sarko Cherekdjian, Janesville, WI (US)

(73) Assignee: SHINE Technologies, LLC, Janesville, WI (US)

( * ) Notice: Subject to any disclaimer, the term of this patent is extended or adjusted under 35 U.S.C. 154(b) by 686 days.

(21) Appl. No.: 17/743,742

(22) Filed: May 13, 2022

(65) Prior Publication Data
US 2022/0363558 A1   Nov. 17, 2022

Related U.S. Application Data

(60) Provisional application No. 63/188,729, filed on May 14, 2021.

(51) Int. Cl.
| | | |
|---|---|---|
| *C01F 17/00* | (2020.01) | |
| *H01J 37/05* | (2006.01) | |
| *H01J 37/08* | (2006.01) | |

(52) U.S. Cl.
CPC .............. *C01F 17/00* (2013.01); *H01J 37/05* (2013.01); *H01J 37/08* (2013.01); *H01J 2237/06375* (2013.01)

(58) Field of Classification Search
CPC . C01F 17/00; H01J 37/05; H01J 37/08; H01J 2237/06375; H01J 37/3178; H01J 2237/055; H01J 2237/3142; B01D 59/48
(Continued)

(56) References Cited

U.S. PATENT DOCUMENTS 6,501,078 B1 * 12/2002 Ryding ................... H01J 37/08
                                                         315/111.81
2006/0249671 A1 * 11/2006 Karpetsky ............. H01J 49/142
                                                         250/288
(Continued)

FOREIGN PATENT DOCUMENTS

WO    WO-2007/067296 A2    6/2007

OTHER PUBLICATIONS

International Search Report and Written Opinion issued for PCT/US2022/029153 dated Sep. 21, 2022.
(Continued)

*Primary Examiner* — Michael Maskell
(74) *Attorney, Agent, or Firm* — Foley & Lardner LLP

(57) ABSTRACT

A system includes an ion source configured to generate ions having a first polarity, one or more extraction electrodes configured to extract the ions from the ion source as an ion beam having an extraction energy, a mass resolving slit or aperture configured to select a desired isotope from the ion beam such that a desired isotopic ion beam passes through the mass resolving slit or aperture, a target positioned relative to the mass resolving slit or aperture so that the desired isotopic ion beam is incident on the target, and a voltage source coupled to the target and configured to hold the target at a first voltage having the first polarity. The first voltage causes a reduction of the extraction energy as the desired isotopic ion beam approaches the target to minimize sputtering and maximize collection of the ions on the target to reconstitute an ionized material.

25 Claims, 2 Drawing Sheets

(58) Field of Classification Search
USPC .......................................... 250/492.1–492.3
See application file for complete search history.

(56) References Cited

U.S. PATENT DOCUMENTS

| | | | |
|---|---|---|---|
| 2014/0087483 A1* | 3/2014 | Ohsawa | H01J 37/3053 |
| | | | 438/3 |
| 2016/0071713 A1* | 3/2016 | Farmer, III | H01J 49/04 |
| | | | 250/282 |

OTHER PUBLICATIONS

Lin. "Kinetic energy and spatial distribution of ions in high irradiance laser ionization source" 1184-1185. Journal of Analytical Atomic Spectrometry. Web. 2011 [retrieved on Aug. 2, 2022) retrieved from the Internet: URL: https://www.researchgate.net/publication/255752970_Kinetic_energy_and_spatial_distribution_of_ions_in_high_irradiance_laser_jonization_source; Entire Document.

* cited by examiner

ION PRODUCTION SYSTEM WITH EFFICIENT ION COLLECTION

CROSS-REFERENCE TO RELATED APPLICATIONS

This application claims the benefit of and priority to U.S. Provisional Patent Application No. 63/188,729, filed May 14, 2021, the entire disclosure of which is incorporated by reference herein.

TECHNOLOGY

The present disclosure relates generally to the field of heavy metal ion production, for example production of heavy metal ions used in health care applications. More specifically, the present disclosure relates to improving the efficiency of collecting and constituting ions accelerated out of an ion source at a high extraction energy.

BACKGROUND

Previous technologies that involve ion beams are typically intended to provide high-energy collisions between the ion beam and a substrate material, in order to create changes to the substrate material. The ions themselves in such systems are not efficiently retained in the substrate material, and they may be sputtered, sublimated, or scattered away. Such systems and methods do not provide for high-efficiency collection of the ions themselves. In contrast, one goal of the present application is collection of the ions of the ion beam as a constituted material which can be collected, stored, transported, used, etc., for example in health care applications.

SUMMARY

One implementation of the present disclosure is a system, for example an ion production system. The system includes an ion source configured to generate ions having a first polarity, extraction electrodes configured to extract the ions from the ion source as an ion beam having an extraction energy, a target positioned relative to the extraction system so that the ion beam is incident on the target, and a voltage source coupled to the target and configured to hold the target at a first voltage having the first polarity. The first voltage causes a kinetic energy reduction of the ions at the extraction energy, so that the effective potential energy of the target ions at the target becomes the difference between the extraction voltage and the first voltage of the target. This effective lower energy minimizes sputtering, reduces heat load on the target, and maximizes collection of the ions on the target. When the effective energy becomes similar or lower than the thermal energy of the evaporated ions, the ions may be deposited as thin films on substrates, thus maximizing the capture of ions.

In some embodiments, the first voltage is less than the extraction energy. The first voltage may also be greater than 95% of the extraction potential or greater than 99% of the extraction potential. The first voltage may be less than the extraction potential by an amount that corresponds to a thermal energy of the ions. The first voltage may be approximately 100 V less than the extraction potential such that the ion beam has an energy of approximately 100 V when the ion beam reaches the target (noting that ion kinetic energy is often expressed in volts in this context, with one volt equaling one joule per coulomb; in other conventions, these values may be expressed in eV).

In some embodiments, the extraction energy is between 20 kV and 80 kV, for example between 40 kV and 60 kV. In some embodiments, the first polarity is positive.

In some embodiments, the target is configured to collect the ionized material as a film on the target. In some embodiments, the system also includes a mass-resolving aperture between the extraction electrodes and the target, wherein the aperture is configured to block an undesired subset of the ions from reaching the target.

In some embodiments, the ions include ytterbium ("Yb") ions. The target may include a crystal structure. The target may include a carbon fiber material.

Another implementation of the present disclosure is a method for collecting ions. The method includes providing an ion beam with an extraction energy. The ion beam includes ions having a first polarity. The method also includes positioning a target such that the ion beam is incident on the target, holding the target at a first voltage having the first polarity such that the first voltage causes a reduction of the extraction energy as the ion beam approaches the target, and collecting the ions on the target.

In some embodiments, the method also includes removing the ions from the target as a constituted neutral material. The ions may include ytterbium atoms.

The extraction potential may be greater than the voltage of the target. In some embodiments, the first voltage and the extraction potential differ by an amount corresponding to a thermal energy of the ions. Providing the ion beam with the extraction energy may include accelerating the ions out of an ion source using an electrode held at an extraction voltage. The extraction voltage may have the first polarity and is greater than the voltage of the target.

Another implementation of the present disclosure is a system including an ion source configured to generate ions having a first polarity, one or more extraction electrodes configured to extract the ions from the ion source as an ion beam having an extraction energy, a mass resolving slit or aperture configured to select a desired isotope from the ion beam such that a desired isotopic ion beam passes through the mass resolving slit or aperture, a target positioned relative to the mass resolving slit or aperture so that the desired isotopic ion beam is incident on the target, and a voltage source coupled to the target and configured to hold the target at a first voltage having the first polarity. The first voltage causes a reduction of the extraction energy as the desired isotopic ion beam approaches the target to minimize sputtering and maximize collection of the ions on the target to reconstitute an ionized material. In some embodiments, a magnetic analyzer is positioned between the one or more extraction electrodes and the mass resolving slit or aperture, and the magnetic analyzer is configured to generate a magnetic field configured to cause a separation of the desired isotopes from other isotopes of the ion beam.

BRIEF DESCRIPTION OF THE FIGURES

The disclosure will become more fully understood from the following detailed description, taken in conjunction with the accompanying figures, wherein like reference numerals refer to like elements, in which.

DETAILED DESCRIPTION

Figure 1:
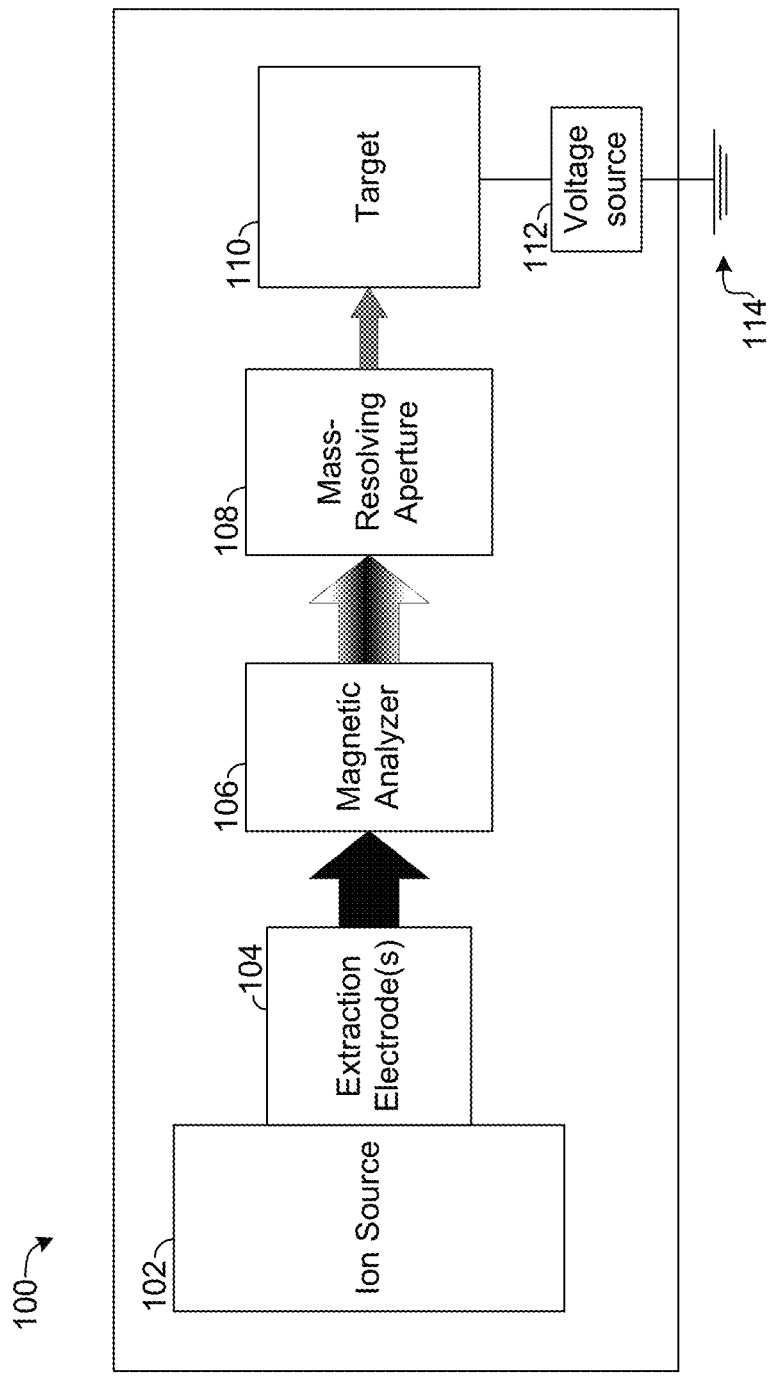
FIG. 1 is a schematic diagram of an ion production system, according to an illustrative embodiment.

Before turning to the figures, which illustrate certain embodiments in detail, it should be understood that the present disclosure is not limited to the details or methodology set forth in the description or illustrated in the figures. It should also be understood that the terminology used herein is for the purpose of description only and should not be regarded as limiting.

Referring generally to the figures, systems and methods relating to an ion production system, for example a heavy metal ion production system, are shown, according to various example embodiments. In particular, the figures generally show systems and methods relating to high-efficiency collection of ions (e.g., heavy metal ions) at a target of the ion production system, such that the ions are reconstituted as a material which can then be collected, stored, transported, used, etc. for various applications.

As detailed below, the ions are generated in an ion source and extracted out of the ion source as an ion beam having a high extraction energy, for example between 20 kV and 80 kV (e.g., between 40 kV and 60 kV) (noting that ion kinetic energy is often expressed in volts in this context, with one volt equaling one joule per coulomb; in other conventions these values may be expressed in keV). The ion beam may be passed through a magnetic analyzer, which uses a magnetic field to sort ions by momentum (or, if the charges of all the generated ions are the same, by atomic mass), and a mass-resolving aperture which is arranged relative to the beam and the magnetic analyzer to primarily pass desired ions (e.g., ions of a desired isotope) while blocking other ions from passing through the aperture. An ion beam having only the desired ions or a high percentage of the desired ions is thus passed through the aperture. The target (target substrate, substrate, etc.) is positioned such that the beam of desired ions is incident on the target.

The approaches described herein provide for a high rate of ion sticking to the target and low sputtering rates at the target, thus increasing the percentage of the ions that are constituted as a neutral material (e.g., of the desired isotope) and decreasing the percentage of the ions which are lost. The overall efficiency (e.g., power and resource consumption per unit of material produced) of the whole ion production system are thus improved. Build-up of the ions on other, undesired surfaces of the ion production system (which may otherwise result from scattering of ions) is also minimized or prevented, thereby reducing downtime and maintenance of the ion production system. Additionally, the approaches herein can reduce heat transfer to the target substrate (heat load on the target, thermal energy load on the target) and thus reduce or eliminate a temperature management issue that may otherwise be caused by high-energy collisions at the target.

As detailed below, the advantages herein are achieved in part by holding the target at a voltage having the same polarity as the ions and having a magnitude slightly below the potential of the ion beam. The voltage of the target (and the electric field created by that voltage) causes a reduction in energy of the ion beam as the ion beam approaches the target. For example, the voltage of the target may be selected to offset (at least partially) the energy added to the ion beam provided by the extraction electrodes, such that the energy of the ions is reduced to a thermal energy as the ions reach the target. In such cases, both electronic stopping (i.e., interactions between the ions and the target interactions between electrons of the ions and electrons of the target substrate) and nuclear stopping (i.e., interactions between the nuclei of the ions and nuclei of the target substrate) of the ions at the target are reduce to zero, or near-zero, levels. By reducing these interactions via the potential of the target, the ions are caused to stick and form as a film at the target rather than colliding with the target at high energies and sputtering or scattering away.

Referring now to FIG. 1, a block diagram of an ion production system 100 is shown, according to an illustrative embodiment. The ion production system 100 includes an ion source 102, extraction electrode(s) 104, a magnetic analyzer 106, a mass-resolving aperture 108, a target 110, and a voltage source 112 connected to ground 114 and to the target 110. The ion source 102, the extraction electrode(s) 104, the magnetic analyzer 106, the mass-resolving aperture 108, and the target 110 are arranged sequentially such that ions are generated at the ion source 102 and sequentially pass the extraction electrode(s) 104, magnetic analyzer 106, and mass-resolving aperture 108 before reaching the target 110. As detailed below, the ion production system 100 is configured to provide efficient collection of desired ions at the target 110 as a constituted, neutral material which can be removed, stored, transported, etc., and eventually used for some application, for example a healthcare application.

The ion source 102 is configured to produce ions. For example, the ion source 102 may be configured as a Bernas or Freeman ion source, which includes a filament operable to emit electrons which ionize a gas provided into the ion source 102, for example a heavy metal gas such as a ytterbium vapor. Other metals (Lu, Tc, etc. may also be used). Interactions between the electrons and the gas ionize the gas to produce ions. In some embodiments, the ion source 102 produces positive ions (i.e., "cations," ions having a positive polarity). In other embodiments, the ion source produces negative ions (i.e., "anions," ions having a negative polarity). The ion source 102 includes an outlet slit or aperture so that the ions can be extracted from the ion source 102. In some embodiments, the ion source 102 includes auxiliary heaters to protect elements of the ion source 102 and to improve uniformity of the ions for extraction from the ion source 102, for example as described in detail in U.S. Provisional Patent Application No. 63/122,699, filed Dec. 8, 2020, the entire disclosure of which is incorporated by reference herein.

The extraction electrode(s) 104 includes one or more electrodes that are configured and operated to provide an electric field that extracts the ions from the ion source 102. Because the ions have an electric charge of a first polarity (positive or negative in different embodiments), a voltage of the opposite polarity at the extraction electrode(s) 104 will pull the ions out of the ion source as an ion beam. The extraction electrode(s) 104 may include one or more electrodes to accelerate the ion beam, decelerate the ion beam, shape the beam, aim the beam, etc. By providing an electric field that accelerates the ion beam out of the ion source 102, the extraction electrode(s) 104 provide the ion beam with an extraction energy of the same or similar magnitude as a voltage of the extraction electrode(s) 104. For example, an electrode at a voltage of 55 kV can provide the ion beam with an extraction energy of 55 kV (noting that ion kinetic energy is often expressed in volts in this context, with one volt equaling one joule per coulomb) as the ion beam pass the extraction electrode(s) 104.

An ion beam having a high extraction energy is thus provided as an output of the extraction electrode(s) 104. In various embodiments, the high extraction energy can be in a range between 20 kV and 80 kV, for example between 40 kV and 60 kV (e.g., 55 kV). In such embodiments, the voltage applied at the extraction electrode(s) 104 can be selected to provide the ion beam with the desired extraction energy for a particular scenario.

In the example of FIG. 1, the ion beam passes from the extraction electrodes 104 to the magnetic analyzer 106. In other embodiments, the magnetic analyzer 106 is omitted. The magnetic analyzer 106 is configured to provide a magnetic field that creates magnetic forces on the ion beam. The magnetic force on each ion may be approximately equal, but the ion beam may include ions of different isotopes, such that the masses of the ions vary. The magnetic force provided by the magnetic analyzer 106 may result in a separation of ions by mass. Thus, after passing through the magnetic analyzer 106, different areas of a transverse cross-section of the ion beam may include different isotopes, i.e., ions of different mass.

In FIG. 1, the ion beam is illustrated to pass from the magnetic analyzer 106 to the mass-resolving aperture 108, and the mass-resolving aperture 108 is configured to block an undesired subset of the ions from passing through the mass-resolving aperture 108, while allowing desired ions to pass through the mass-resolving aperture 108. In particular, ions allowed through the mass-resolving aperture 108 are primarily ions of a desired isotope (or two desired isotopes), while ions of one or more other isotopes are intercepted by the mass-resolving aperture 108. This is achieved by positioning the mass-resolving aperture 108 relative to the magnetic analyzer 106 to take advantage of the separation of isotopes by mass achieved by the magnetic analyzer 106. Various geometric arrangements are possible in various embodiments. Thus, in examples including the magnetic analyzer 106 and the mass-resolving aperture 108, the ion beam that reaches the target 110 includes a high percentage of a desired isotope or desired isotopes, with a low percentage of contamination by ions of different isotopes.

The ion beam from the mass-resolving aperture 108 is incident on target 110. The target 110 is configured to receive and collect the ions of the ion beam. The target 110 can include a substrate material suitable for receiving and retaining the ions, including as a film on a surface of the target 110 and/or embedded in a lattice structure of the target 110. For example, the substrate material of the target 110 may have a crystal structure. As another example, the substrate material of the target 110 may include a carbon fiber material (e.g., a carbon fiber cloth). The material(s) of the target 110 are also selected such that the target 110 is capable of being held at a substantially-constant voltage as ions are collected on, implanted in, or other received at the target 110. The material(s) of the target 110 may be selected to help cause sticking of the ions to or in the target 110. The target 110 may be removable and replaceable in the ion production system 100 to facilitate harvesting of the ionic material that builds up on the target 110 during operation of the ion source 102.

Figure 3:
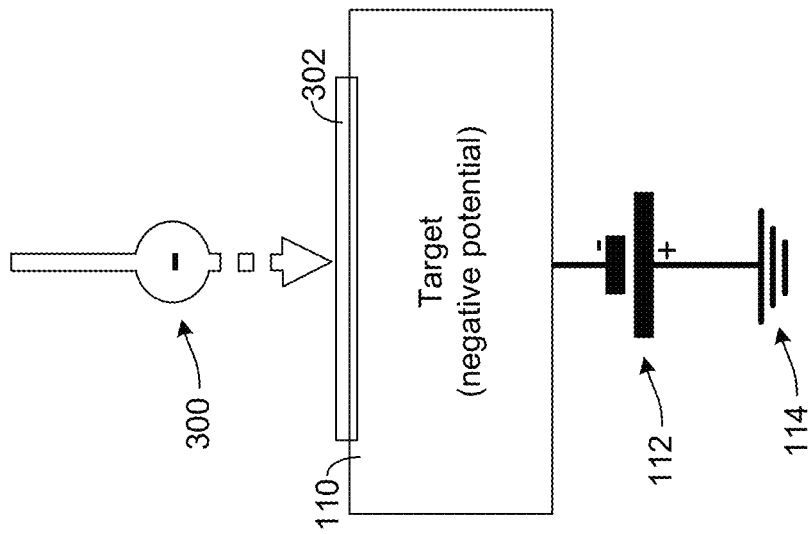
FIG. 3 is a schematic diagram of a target and voltage source of the ion production system in an embodiment involving negative ions, according to an illustrative embodiment.

The target 110 is shown as being coupled to a voltage source 112, which is connected between the target 110 and ground 114. Other elements of the ion production system 100 also include suitable electronics elements, power sources, etc. to enable operation thereof. The voltage source 112 is configured to hold (put, establish, maintain, etc.) the target 110 at a voltage (referred to herein as the target voltage) which has the same polarity of the ion beam. For example, as illustrated in FIGS. 2-3 and discussed below, a positive voltage is provided to the target 110 by the voltage source 112 in scenarios where positive ions are generated by the ion source, while a negative voltage is provided to the target 110 by the voltage source 112 in scenarios where negative ions are generated by the ion source.

The target voltage is preferably less than the extraction energy of the ion beam, such that the ion beam is able to reach the target without being forced in the opposite direction by the target voltage, while being high enough to reduce the energy of ion beam far enough to minimize both electronic and nuclear stopping of the ion beam at the target 110 (thereby minimizing scattering or sputtering that would otherwise be caused by high-energy collisions between the ions and the target 110). For example, the target voltage may be less than the extraction energy by an amount corresponding to a thermal energy of the ions, such that the energy of the ions is reduced to thermal energy just as the ions reach the target 110. In various embodiments, the target voltage is both less than the extraction energy and greater than 95% of the extraction energy, for example greater than 99% of the extraction energy (while also being less than the extraction energy). In some examples, the target voltage is approximately 100 V less than the extraction energy such that the ion beam has an energy of approximately 100 V when the ion beam reaches the target (e.g., extraction energy minus target voltage equals approximately 100V). In one example, the extraction energy is 55 kV and the target voltage is 54.9 kV.

In some embodiments, the voltage source 112 and the target 110 are configured so that the voltage of the target 110 stays substantially constant throughout operation of the ion production system 100 and as ions collect on the target 110 (e.g., as a film on the target 110, embedded in the target 110) and are constituted into a neutral material (e.g., of the desired isotope(s)). In some cases, to facilitate removal of the constituted ionized material from the target 110, the target 110 can be removable from the ion production system 100. In some such cases, the voltage source 112 is controlled to gradually reduce the target voltage toward zero to enable the target 110 to be disconnected from the voltage source 112 without disrupting the ionized material collected thereon. In some embodiments, the target 110 (or a portion thereof) is removed for use in transport and further processing of the ionized material, and replaced with a new target 110 (or new portion thereof) for use in subsequent operation of the ion production system 100. In other embodiments, the ionized material can be removed from the target 110 and collected in a receptacle (or other collection and retention device) such that the target 110 can be reused in a subsequent operation of the ion production system 100 to collect more ions.

Figure 2:
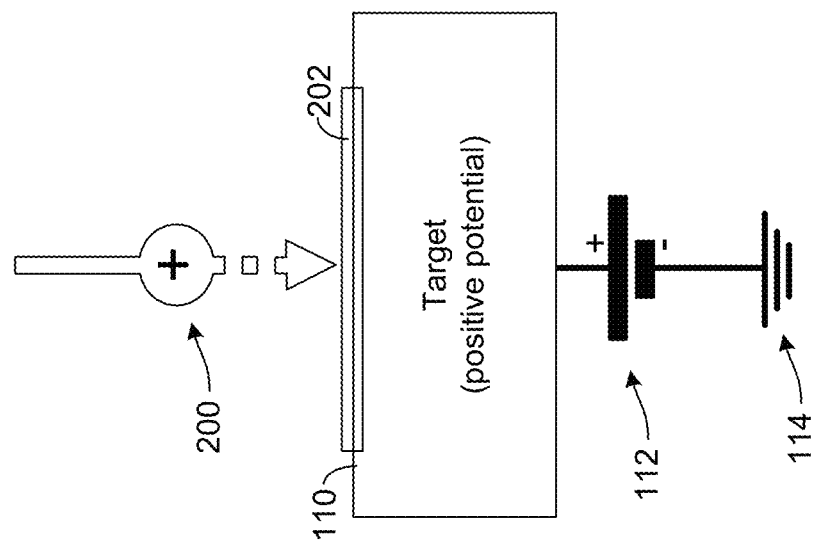
FIG. 2 is a schematic diagram of a target and voltage source of the ion production system in an embodiment involving positive ions, according to an illustrative embodiment.

Referring now to FIG. 2, a schematic illustration of the target 110 and voltage source 112 of the ion production system 100 in an embodiment involving positive ion beam 200 is shown, according to an example embodiment. FIG. 2 shows a positive ion beam 200 (i.e., a beam of positively-charged ions) aimed towards the target 110 and incident on the target 110.

Because the positive ion beam 200 has a positive polarity, the voltage of the target 110 is also provided with a positive polarity. FIG. 2 illustrates that the target 110 is connected to a positive terminal of the voltage source 112, with the negative terminal of the voltage source 112 connected to ground 114. The voltage source 112 holds the target 110 at a positive potential, i.e., an electrical potential of the same polarity as the positive ion beam 200.

The positive potential of the target 110 provides an electric field that resists movement of the ion beam 200 toward the target 110. The ion beam 200 must move across this electric field to reach the target 110. As it does so, kinetic energy of the ion beam 200 is converted into electric potential of the ions in the electric field created by the positive potential of the target 110. This may be thought of as being analogous to the ions rolling "uphill" to reach the target 110. As discussed above, the target voltage is selected and maintained such that the positive ion beam 200 reaches a low energy, for example a thermal energy, just as positive ions reach the target 110. Reduced to thermal energy, the positive ion beam 200 does not have extra kinetic energy that would cause it to move away from the target 110 or cause sputtering or scattering, and, thus, the ions of the positive ion beam 200 stick at the target 110, for example forming as the positive ion film 202 as shown in FIG. 2.

Referring now to FIG. 3, a schematic illustration of the target 110 and voltage source 112 of the ion production system 100 in an embodiment involving negative ion beam 300 is shown, according to an example embodiment. FIG. 2 shows a negative ion beam 300 (i.e., a beam of negatively-charged ions) aimed towards the target 110 and incident on the target 110.

Because the negative ion beam 300 has a negative polarity, the voltage of the target 110 is also provided with a negative polarity. FIG. 3 illustrates that the target 110 is connected to a negative terminal of the voltage source 112, with the positive terminal of the voltage source 112 connected to ground 114. The voltage source 112 holds the target 110 at a negative potential, i.e., an electrical potential of the same polarity as the negative ion beam 300.

The negative potential of the target 110 provides an electric field which resists movement of the ion beam 300 toward the target 110. The ion beam 300 must move across this electric field to reach the target 110. As it does so, kinetic energy of the ion beam 300 is converted into electric potential of the ions in the electric field created by the negative potential of the target 110. This may be thought of as being analogous to the ions rolling "uphill" to reach the target 110. As discussed above, the target voltage is selected and maintained such that the negative ion beam 300 reaches a low energy, for example a thermal energy, just as negative ions reach the target 110. Reduced to thermal energy, the negative ion beam 300 does not have extra kinetic energy that would cause it to move away from the target 110 or cause sputtering or scattering, and, thus, the ions of the negative ion beam 300 stick at the target 110, for example forming as the negative ion film 302 shown in FIG. 3.

The ion production system 100 is thereby configured for highly efficient production and collection of ions as a constituted ionized material. By setting the target 110 at the target voltage as described above, a high percentage of the ions incident on the target 110 are caused to stick at the target 110, for example forming a film at the target 110. The efficiency of the ion production system 100 is thereby improved by providing collection of a high percentage of the desirable ions created by the ion source 102. Additionally, because material is sputtered or scattered away at a low or zero rate, it is also substantially prevented from building up on other, unwanted surfaces in the ion production system 100, thereby reducing downtime, cleaning, maintenance, etc. of the ion production system 100. Additionally, while electronic or nuclear stopping of high energy ions at the target (i.e., collisions between atoms) would cause the thermal energy of the target to increase greatly, the embodiments herein reduce the energy of the ions using the electric potential provided by the voltage source 112 and thereby avoid the build-up of thermal energy at the target.

Although the discussion above gives a general overview of the principles of physics associated with operation of the ion production system 100 and the effects of the target voltage on the ion beam, it should be appreciated that the behavior of ion beams is complex and that additional or alternative theories or experimental results may be used to provide further or alternative explanation of the various advantages of the systems and methods described herein. Experimental results have shown that providing the target 110 with a target voltage of the same polarity as the ion beam as described above provides the advantages described herein.

As utilized herein, the terms "approximately," "about," "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical values or idealized geometric forms provided. Accordingly, these terms should be interpreted as indicating that insubstantial or inconsequential modifications or alterations of the subject matter described and claimed are considered to be within the scope of the disclosure as recited in the appended claims.

The term "coupled" and variations thereof, as used herein, means the joining of two members directly or indirectly to one another. Such joining may be stationary (e.g., permanent or fixed) or moveable (e.g., removable or releasable). Such joining may be achieved with the two members coupled directly to each other, with the two members coupled to each other using a separate intervening member and any additional intermediate members coupled with one another, or with the two members coupled to each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic.

References herein to the positions of elements (e.g., "top," "bottom," "above," "below") are merely used to describe the orientation of various elements in the FIGURES. It should be noted that the orientation of various elements may differ according to other exemplary embodiments, and that such variations are intended to be encompassed by the present disclosure.

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

Other embodiments are set forth in the following claims.

What is claimed is:

1. A system, comprising:
   an ion source configured to generate ions having a first polarity;
   one or more extraction electrodes configured to extract the ions from the ion source as an ion beam having an extraction energy;
   a mass resolving slit or aperture configured to select a desired isotope from the ion beam such that a desired isotopic ion beam passes through the mass resolving slit or aperture;
   a target positioned relative to the mass resolving slit or aperture so that the desired isotopic ion beam is incident on the target, wherein the target comprises a carbon fiber material; and
   a voltage source coupled to the target and configured to hold the target at a first voltage having the first polarity, wherein the first voltage causes a reduction of the extraction energy as the desired isotopic ion beam approaches the target and at least one of minimizes sputtering, reduces heat load on the target, or maximizes collection of the ions on the target to reconstitute an ionized material.

2. The system of claim 1, wherein the first voltage is less than the extraction energy.

3. The system of claim 2, wherein the first voltage is greater than 95% of the extraction energy.

4. The system of claim 2, wherein the first voltage is greater than 99% of the extraction energy.

5. The system of claim 1, wherein the first voltage is less than the extraction energy by an amount that corresponds to a thermal energy of the ions.

6. The system of claim 1, wherein the extraction energy is between 20 kV and 80 kV.

7. The system of claim 1, wherein the extraction energy is between 40 kV and 60 kV.

8. The system of claim 1, wherein the first voltage is approximately 100 V less than the extraction energy such that the desired isotopic ion beam has an energy of approximately 100 V when the desired isotopic ion beam reaches the target.

9. The system of claim 1, wherein the first polarity is positive.

10. The system of claim 1, wherein the target is configured to collect the ionized material as a film on the target.

11. The system of claim 1, further comprising a magnetic analyzer between the one or more extraction electrodes and the mass resolving slit or aperture, wherein the magnetic analyzer is configured to generate a magnetic field configured to cause a separation of the desired isotopes from other isotopes of the ion beam.

12. The system of claim 1, wherein the ions comprise ytterbium ions.

13. The system of claim 1, wherein the target comprises a crystal structure.

14. A method for collecting ions, comprising:
   generating, by an ion source, ions having a first polarity;
   extracting, by one or more extraction electrodes, the ions from the ion source as an ion beam having an extraction energy;
   selecting, by a mass resolving slit or aperture, a desired isotope from the ion beam by allowing a desired isotopic ion beam to pass through the mass resolving slit or aperture;
   positioning a target relative to the mass resolving slit or aperture such that the ion beam is incident on the target;
   holding, by a voltage source coupled to the target, the target at a voltage having the first polarity such that the voltage causes a reduction of the extraction energy as the desired isotopic ion beam approaches the target and at least one of minimizes sputtering, reduces heat load on the target, or maximizes collection of the ions on the target to reconstitute an ionized material; and
   collecting the ions on the target; and
   removing the collected ions from the target as a constituted ionized material.

15. The method of claim 14, wherein the target comprises a carbon fiber material.

16. The method of claim 14, wherein the voltage and the extraction energy differ by an amount corresponding to a thermal energy of the ions.

17. The method of claim 14, wherein extracting, by one or more extraction electrodes, the ions from the ion source as the ion beam comprises accelerating the ions out of the ion source by holding the one or more extraction electrodes at an extraction voltage, wherein the extraction voltage has the first polarity and is greater than the voltage of the target.

18. The method of claim 14, wherein the extraction energy is greater than the voltage.

19. The method of claim 14, wherein the ions comprise ytterbium atoms.

20. A system, comprising:
   an ion source configured to generate ions having a first polarity, wherein the ions comprise ytterbium ions;
   one or more extraction electrodes configured to extract the ions from the ion source as an ion beam having an extraction energy;
   a mass resolving slit or aperture configured to select a desired isotope from the ion beam such that a desired isotopic ion beam passes through the mass resolving slit or aperture;
   a target positioned relative to the mass resolving slit or aperture so that the desired isotopic ion beam is incident on the target; and
   a voltage source coupled to the target and configured to hold the target at a first voltage having the first polarity, wherein the first voltage causes a reduction of the extraction energy as the desired isotopic ion beam approaches the target and at least one of minimizes sputtering, reduces heat load on the target, or maximizes collection of the ions on the target to reconstitute an ionized material.

21. A method for collecting ions, comprising:
   generating, by an ion source, ions having a first polarity;
   extracting, by one or more extraction electrodes, the ions from the ion source as an ion beam having an extraction energy;
   selecting, by a mass resolving slit or aperture, a desired isotope from the ion beam by allowing a desired isotopic ion beam to pass through the mass resolving slit or aperture;
   positioning a target relative to the mass resolving slit or aperture such that the ion beam is incident on the target;
   holding, by a voltage source coupled to the target, the target at a voltage having the first polarity such that the voltage causes a reduction of the extraction energy as the desired isotopic ion beam approaches the target and at least one of minimizes sputtering, reduces heat load on the target, or maximizes collection of the ions on the target to reconstitute an ionized material, wherein the voltage and the extraction energy differ by an amount corresponding to a thermal energy of the ions; and collecting the ions on the target.

22. The method of claim 21, wherein the target comprises a carbon fiber material.

23. The method of claim 22, further comprising removing the collected ions from the target as a constituted ionized material.

24. A method for collecting ions, comprising:

generating, by an ion source, ions having a first polarity, wherein the ions comprise ytterbium atoms;

extracting, by one or more extraction electrodes, the ions from the ion source as an ion beam having an extraction energy;

selecting, by a mass resolving slit or aperture, a desired isotope from the ion beam by allowing a desired isotopic ion beam to pass through the mass resolving slit or aperture;

positioning a target relative to the mass resolving slit or aperture such that the ion beam is incident on the target;

holding, by a voltage source coupled to the target, the target at a voltage having the first polarity such that the voltage causes a reduction of the extraction energy as the desired isotopic ion beam approaches the target and at least one of minimizes sputtering, reduces heat load on the target, or maximizes collection of the ions on the target to reconstitute an ionized material, wherein the voltage and the extraction energy differ by an amount corresponding to a thermal energy of the ions; and collecting the ions on the target.

25. The method of claim 24, wherein the target comprises a carbon fiber material.

* * * * *